United States Patent [19]

Heiland

[11] Patent Number: 4,766,519
[45] Date of Patent: Aug. 23, 1988

[54] HOUSING, PARTICULARLY FOR HAND HELD DEVICES

[76] Inventor: Bernd Heiland, Hermann-Löns-Strasse 11, 4410 Warendorf, Fed. Rep. of Germany

[21] Appl. No.: 937,979

[22] Filed: Dec. 4, 1986

[51] Int. Cl.⁴ .............................................. H05K 1/02
[52] U.S. Cl. ..................................... 361/399; 206/334; 206/449; 206/602; 220/4 B; 220/DIG. 25; 361/395
[58] Field of Search ............... 206/334, 449, 602; 174/52 R; 220/4 B, 4 E, 8, DIG. 25; 211/41; 361/380, 395, 397, 399, 417, 419, 392, 393, 412, 415; 220/346, 347

[56] References Cited

U.S. PATENT DOCUMENTS

| | | | |
|---|---|---|---|
| 1,654,225 | 12/1927 | Tanner | 220/DIG. 25 |
| 3,146,435 | 8/1964 | Kelly | 174/52 R |
| 3,487,921 | 1/1970 | Barth | 206/334 |
| 3,563,405 | 2/1971 | Zaremski | 206/602 |
| 3,781,875 | 12/1973 | King | 174/52 R |
| 3,950,603 | 4/1976 | Brefka | 174/52 R |
| 4,007,828 | 2/1977 | Mayled | 220/8 |
| 4,040,536 | 8/1977 | Schwarz | 220/8 |
| 4,126,224 | 11/1978 | Laauwe | 220/347 |
| 4,284,204 | 8/1981 | Carey, Jr. | 220/8 |
| 4,506,238 | 3/1985 | Endoh | 361/395 |
| 4,657,136 | 4/1987 | Yokota | 206/334 |

FOREIGN PATENT DOCUMENTS

| | | |
|---|---|---|
| 3004271 | 8/1981 | Fed. Rep. of Germany . |
| 3230545 | 2/1984 | Fed. Rep. of Germany . |
| 3334272 | 4/1985 | Fed. Rep. of Germany . |

*Primary Examiner*—G. P. Tolin
*Attorney, Agent, or Firm*—Felfe & Lynch

[57] ABSTRACT

A housing or enclosure, which is particularly suitable for electronic circuits, comprises two housing parts that fit together and interlock. Each housing part is substantially U-shaped in cross-section and has an end cover that covers the total cross-section of the closed housing. The opposing interfacing surfaces of the longitudinal edges of the housing are profiled in the longitudinal direction, enabling the two housing parts to be fitted together in the transverse direction to the longitudinal axis of the housing, and at the same time serving as guiding rails to allow the housing parts to slide against one another in the longitudinal direction of the housing. This housing construction permits the housing to be assembled easily and permits the length of the housing to be varied in a simple manner.

3 Claims, 1 Drawing Sheet

HOUSING, PARTICULARLY FOR HAND HELD DEVICES

BACKGROUND OF THE INVENTION

The invention relates to a housing, preferably for hand held devices, as an enclosure which is particularly suitable for electronic circuits with indicators and/or operating elements, consisting of housing parts which fit together and interlock.

The type of housing referred to is already known from the commonly-owned German Patent Application No. P 33 4 272.5. This housing consists of a section of an extruded tubular profile of variable length and two end pieces, or end caps, which close the ends of the tubular profile. The disadvantage of this type of housing is that it can only be entered from the ends. Furthermore, with extruded profiles longitudinal ridges occur which have a particularly disturbing optical effect with transparent housings.

The German published patent application No. DE-OS No. 32 30 545 discloses a housing which consists of two interlocking half-box shaped parts. These form a housing of a fixed size so that for any other size of housing other housing parts are necessary which require other molds for their production. Moreover, with this type of housing, after the initial interlocking the housing parts can only be opened again by damaging or destroying the housing. As such, multiple use is impossible.

In addition, the German published patent application No. DE-OS No. 30 04 271 shows a modular housing which, although its length is variable, consists of numerous different components, such as base plates, side pieces, corner pieces and top cover, which means that an individual mold is required to produce each part. Even for the smallest possible size of housing, a minimum of five components are needed. Also, it is only possible to vary the length of the housing in steps which have been predetermined by the manufacturer. This means that universal application with a free choice over the size of the housing is excluded. Finally, the housing is not intended for hand-held applications, rather only for wall mounting.

SUMMARY OF THE INVENTION

The principal object of the present invention is to produce a housing of the type initially mentioned herein, the size of which can be varied in a simple manner, which can be assembled easily, which can be continually reused and which exhibits a high quality external appearance.

This object, as well as other objects which will become apparent in the discussion that follows are achieved in accordance with the invention, by providing a housing of the above-mentioned type which is characterized by two predominantly U-shaped one-piece housing parts, each with an end piece which completely covers the cross-section of the closed housing, and with the opposing interfacing surfaces of the longitudinal edges of the housing being profiled in the longitudinal direction enabling the housing parts to be fitted together in the transverse direction to the longitudinal axis of the housing and at the same time serving as guiding rails to allow the housing parts to slide against one another in the longitudinal direction of the housing.

This housing has the advantage of being able to be adapted to the individual size requirements of the user by simply shortening the housing through cutting off the same length from both parts of the housing. Moreover, the housing consists of only two parts which allows a cost-effective production. Additional accessories for fixing the housing parts together are not necessary, thus the assembly of the housing is as simple and as rapid as possible.

An example of the preferred type of housing will now be described in detail with reference to the accompanying drawing.

DESCRIPTION OF THE PREFERRED EMBODIMENT

Figure 1:
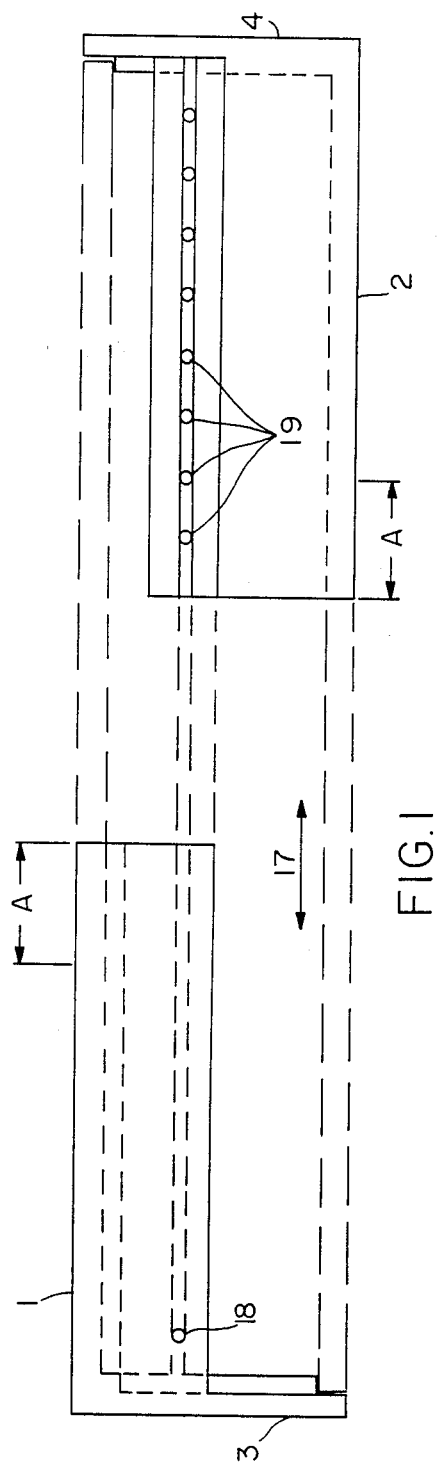
FIG. 1 is a side elevational view of a housing, according to the present invention, shown with the housing parts pulled apart.

As can be seen in FIG. 1, the preferably injection molded housing 1 and 2 consists of two parts. The housing parts are both one-piece and both have a predominantly U-shaped cross-section with an end piece 3 and 4 which covers the complete cross-section of the closed housing 1 and 2, respectively, and serves as an end cover for the housing. As can be clearly seen from FIG. 1, if both housing parts 1 and 2 are shortened by the dimension "A" at a right angle—i.e., cut off parallel to the housing end covers 3 and 4—the housing will again close cleanly and it will be shortened by the amount "A". Thus, the housing, as described in the invention, is very cost effective to manufacture because the tooling costs only occur once; namely, for the largest size of housing. Consequently, these costs can be apportioned over a much larger quantity of housings.

Correspondingly lower storage costs for the user results with the housing according to the invention. Also advantageous is the possibility of individually adapting the length of the housing to suit the precise surface area requirement, e.g., of a printed circuit board to be fitted within the housing.

Figure 2:
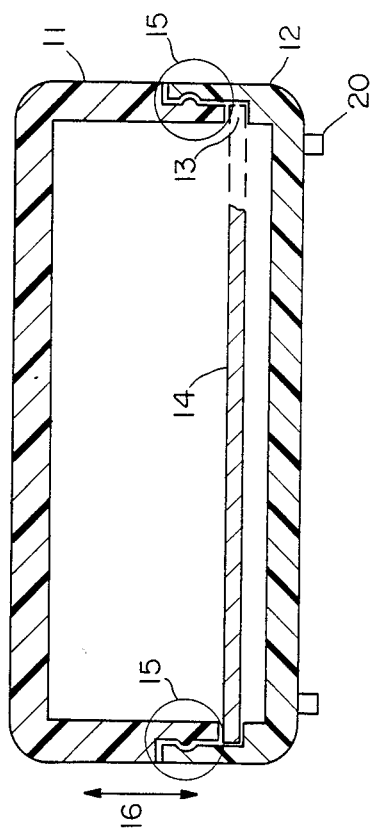
FIG. 2 is a cross-sectional view of the housing of FIG. 1 with the housing parts assembled together.

The advantageous features of the longitudinal edges of the housing parts 1 and 2 are detailed, in FIG. 2, in which the housing part 1 forms the upper housing part and housing part 2 the lower housing part. The longitudinal edges of the housing parts have a profiled form (region 15) in the longitudinal direction of the housing so that an interlocking of the two housing parts 1 and 2 in the vertical direction 16 is made possible. Moreover, the profile shape on the inside of the housing part 2 is so designed as to provide a gap 13 for accepting and fixing a printed circuit board 14. Further interlocking in the longitudinal direction 17 of the housing is facilitated by a pair of locking projections 18 in the profiled longitudinal edge near the end cover 3 of housing part 1 and numerous pairs of notches 19 at equal spacing, e.g., at intervals of 5 mm, along the longitudinal edges of the housing part 2. The arrangement of the locking projections 18 and the notches 19, which is applicable to both longitudinal edges of the housing parts 1 and 2, can be seen in FIG. 1.

This arrangement also allows the housing length to be shortened while offering the full number of the intervalled notches, whereby the interlocking of housing parts 1 and 2 in the longitudinal direction 17 remains unaffected.

The housing parts 1 and 2 may be made of any suitable material. Preferably, however, they are made of plastic to provide electrical insulation for the internal electrical elements. Advantageously, at least a portion of the plastic is made transparent so that lights, etc., inside the housing are visible.

In a preferred embodiment of the invention, the housing is provided with guiding profiles 20 (FIG. 2) arranged parallel to the housing's edges to permit attachment of a stand or a second housing.

There has thus been shown and described a novel housing, particularly for hand held devices, which fulfills all the objects and advantages sought therefor. Many changes, modifications, variations and other uses and applications of the subject invention will, however, become apparent to those skilled in the art after considering this specification and the accompanying drawings which disclose the preferred embodiment thereof. All such changes, modifications, variations and other uses and applications which do not depart from the spirit and scope of the invention are deemed to be covered by the invention which is limited only by the claims which follow.

What is claimed is:

1. In a housing for an electronic circuit having parts which fit together and interlock, the improvement which comprises providing only two single-piece housing parts, each housing part being substantially U-shaped in cross-section and having a single end cover that covers the total cross-section of the closed housing, the opposing interfacing surfaces of the longitudinal edges of the housing being profiled in the longitudinal direction which enables said housing parts to be fitted together in the transverse direction to the longitudinal axis of the housing and at the same time serving as guiding rails to allow said housing parts to slide against in the longitudinal direction of the housing, wherein one of the housing parts has at least one protruding locking knob on each of its longitudinal edges and the other housing part has a plurality of locking notches along each of its longitudinal edges, said notches being equally spaced along the full length of the housing at appropriate distances to enable the two housing parts to interlock in the longitudinal direction of the housing, and wherein said housing parts fit together so as to provide spaces along the inside of their longitudinal edges which form elongated gaps in the longitudinal direction of the housing that support a printed circuit board.

2. The housing according to claim 1, which is made of transparent plastic.

3. The housing according to claim 1, wherein the external surface of the housing has guiding profiles arranged parallel to the housing's edges for attaching a stand or a second housing.

* * * * *